United States Patent
Lee

(10) Patent No.: US 6,472,302 B1
(45) Date of Patent: Oct. 29, 2002

(54) INTEGRATION METHOD FOR RAISED CONTACT FORMATION FOR SUB-150 NM DEVICES

(75) Inventor: Brian Lee, Hsinchu (TW)

(73) Assignee: ProMos Technologies, Inc., Hsin-Chu (TW)

( * ) Notice: Subject to any disclaimer, the term of this patent is extended or adjusted under 35 U.S.C. 154(b) by 0 days.

(21) Appl. No.: 09/993,421

(22) Filed: Nov. 6, 2001

(30) Foreign Application Priority Data

Jun. 12, 2001 (CN) .......................................... 090114159

(51) Int. Cl.⁷ ............................................. H01L 21/44
(52) U.S. Cl. ...................... 438/597; 438/256; 438/394; 438/399; 438/597; 438/625; 438/629; 438/647; 438/657; 438/659; 438/674; 438/684
(58) Field of Search ................................. 438/256, 394, 438/399, 597, 625, 629, 647, 657, 659, 674, 684

(56) References Cited

U.S. PATENT DOCUMENTS

| | | | |
|---|---|---|---|
| 4,912,065 A | 3/1990 | Mizuno et al. ............. 437/141 |
| 5,718,800 A | 2/1998 | Juengling ................. 156/643.1 |
| 5,904,770 A | 5/1999 | Ohtani et al. ............... 117/103 |
| 6,008,104 A | 12/1999 | Schrems ..................... 438/386 |
| 6,072,241 A | * 6/2000 | Kojima ....................... 257/752 |
| 6,090,691 A | 7/2000 | Ang et al. ................... 438/564 |
| 6,121,109 A | * 9/2000 | Chen et al. ................. 438/396 |
| 6,136,643 A | 10/2000 | Jeng et al. .................. 438/253 |
| 6,187,630 B1 | * 2/2001 | Chen et al. ................. 438/255 |
| 6,333,233 B1 | * 12/2001 | Kojima ....................... 438/396 |
| 2001/0045658 A1 | * 11/2001 | Deboer et al. .............. 257/758 |

* cited by examiner

Primary Examiner—John F. Niebling
Assistant Examiner—Lynne A. Gurley
(74) Attorney, Agent, or Firm—George O. Saile; Stephen B. Ackerman; Rosemary L. S. Pike

(57) ABSTRACT

An integrated raised contact formation method to achieve ultra shallow junction devices is described. Semiconductor device structures are provided in and on a substrate and covered with a dielectric layer. The dielectric layer is etched through to form first openings to the substrate. The surface of the substrate exposed within the first openings is amorphized. A silicon layer is selectively formed on the amorphized substrate surface. Then, ions are implanted into the silicon layer to form raised contacts. Thereafter, the dielectric layer is etched through to form second openings to gates. The first and second openings are filled with a conducting layer to complete formation of contacts in the fabrication of an integrated circuit device.

30 Claims, 6 Drawing Sheets

INTEGRATION METHOD FOR RAISED CONTACT FORMATION FOR SUB-150 NM DEVICES

RELATED U.S. PATENT APPLICATION

U.S. patent application Ser. No. 09/898,125 (PR-90-004/007) to Brian Lee, filed on Jul. 5, 2001.

BACKGROUND OF THE INVENTION

(1) FIELD OF THE INVENTION

The present invention relates to the fabrication of integrated circuit devices, and more particularly, to a method of fabricating a raised contact to achieve ultra-shallow junction devices in the fabrication of integrated circuits.

(2) DESCRIPTION OF THE PRIOR ART

In the fabrication of integrated circuit devices, as the ground rule shrinks below a sub-250 nm regime, a shallow junction (less than 100 nm) is required. Although substantial progress has been made to form a shallow junction by utilizing low energy implantation followed by a rapid thermal process (RTP) anneal, little attention has been paid to contact formation over the shallow junction. To fabricate fully functional devices, a healthy contact needs to be made to provide low resistance contact to a source/drain junction surface. However, a concurrent achievement of low resistance and shallow contact is not trivial due to a principle limitation: to form low resistance, a high dose implantation is needed and to form a shallow junction, a low energy implantation is needed.

A low energy implantation suffers from a low beam current due to its space charge limitation principle. In order to form a low resistant contact, a high dose implantation is needed to overcome the Schottky barrier to form an ohmic contact. However, due to the space charge limited current criteria, a high energy implantation is needed. Therefore, generally a high dose (higher than that of the junction) and high energy (higher than that of the junction) contact implantation is performed, but located away from a gate side. This will result in a deeper contact junction than the depth of the source/drain junction. As the ground rule shrinks, overlap control does not improve as much as critical dimension control resulting in poor misalignment (>30%) between layers. This will result in contact to gate electrode misalignment. Thus, the deeper contact junction will impact device performance causing a short-channel effect (SCE) and threshold voltage lowering.

The contact junction is typically implanted onto a bare silicon surface while the source/drain junction is implanted through a screen oxide. For a low energy implantation, a significant portion of the dopants, more than 50%, remain within the screen oxide. To ultimately resolve the contact issue for future devices, a raised contact formation will be ideal.

A number of patents have addressed aspects of junction and contact fabrication. U.S. Pat. No. 6,009,691 to Ang et al discloses a method for forming source/drains without using selective epitaxial growth. U.S. Pat. No. 6,008,104 to Schrems shows a DRAM process with plasma doped source/drains, several selective etches, and a contact process. U.S. Pat. No. 5,904,770 to Ohtani et al shows a method of patterning an amorphous silicon layer and then forming raised source/drains in this layer by plasma doping. U.S. Pat. No. 4,912,065 to Mizuno et al teaches a plasma doping process. U.S. Pat. No. 5,718,800 to Juengling and 6,136,643 to Jeng et al show contact processes and nitride caps over gates.

SUMMARY OF THE INVENTION

Accordingly, it is a primary object of the present invention to provide an effective and very manufacturable method of raised contact formation in the fabrication of integrated circuits.

It is a further object of the invention to form raised contacts using polysilicon.

Another object of the invention is to form raised contacts using polysilicon deposited by a hemispherical grain (HSG) method.

Yet another object of the invention is to form raised polysilicon contacts integrated with a low energy implantation method to form shallow junctions.

A still further object of the invention is to form raised polysilicon contacts using selective polysilicon deposition at a controlled grain size wherein the polysilicon layer is implanted to achieve ultra shallow junction devices.

In accordance with the objects of the invention, an integrated raised contact formation method to achieve ultra shallow junction devices is achieved. Semiconductor device structures are provided in and on a substrate and covered with a dielectric layer. The dielectric layer is etched through to form first openings to the substrate. The surface of the substrate exposed within the first openings is amorphized. A silicon layer is selectively formed on the amorphized substrate surface. Then, ions are implanted into the silicon layer to provide dopants into the raised contacts. Thereafter, the dielectric layer is etched through to form second openings to gates. The first and second openings are filled with a conducting layer to complete formation of contacts in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention provides a method for forming a raised polysilicon contact to achieve ultra-shallow junction devices. In the method of the present invention, a selective polysilicon deposition at a controlled grain size is performed within contact openings. The polysilicon layer is implanted with a low energy, high dosage implantation. The doped polysilicon layer acts as a consumable contact layer to compensate for junction penetration into the silicon during silicidation. The method of the present invention can be applied to both DRAM and non-DRAM devices.

Figure 1:
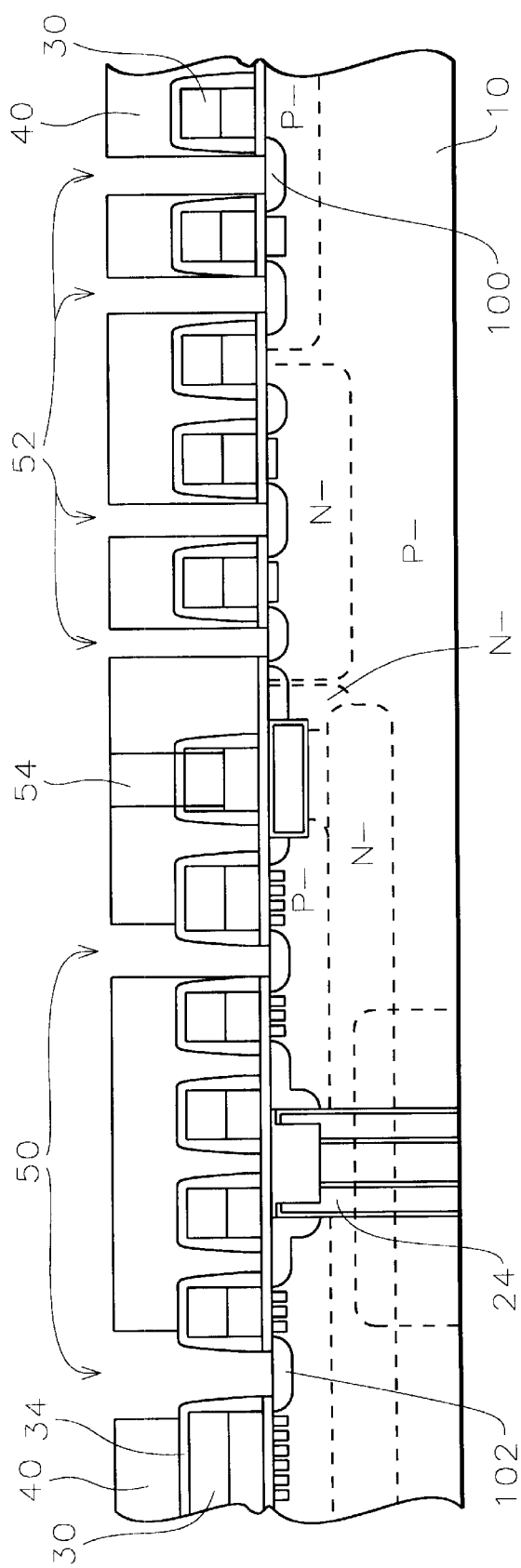
FIGS. 1 through 6 are cross-sectional representations of a preferred embodiment of the present invention.

Referring now more particularly to FIG. 1, there is shown a semiconductor substrate 10. Deep trench capacitor 24 is shown in the fabrication of a deep trench DRAM integrated circuit device. It will be understood by those skilled in the art that the process of the present invention should not be limited to the deep trench DRAM device illustrated in the figures or to any DRAM device, but may be extended and applied in any application in which both shallow junctions and low resistance contacts to these junctions are required.

Gate electrodes and interconnection lines 30 have been formed overlying the semiconductor substrate. A capping layer 34 covers the top and sidewall surfaces of the gate electrodes and interconnection lines. The capping layer may be a nitride layer such as silicon nitride or silicon oxynitride having a thickness of between about 100 and 300 Angstroms. Source/drain shallow junctions 100 have been formed adjacent to the gate electrodes.

Inter-layer dielectric layer 40 is blanket deposited over the semiconductor device structures. This layer may comprise silicon dioxide, borophosphotetraethoxysilane (BP-TEOS) oxide, borophosphosilicate glass (BPSG), phosphosilicate glass (PSG), or a combination of BPSG and silicon dioxide, and so on, and may be one or more layers. The total thickness of the layer 40 is between about 6000 and 10,000 Angstroms. The top of the inter-layer dielectric layer 40 may be planarized, for example by reflowing of the dielectric material, etchback, or chemical mechanical polishing (CMP), or the like.

To preserve a minimum space between the gate and contact, it is preferable to use a self-aligned contact (SAC) etch process such as that described in co-pending U.S. patent application Ser. No. 09/898,125 (PR-90-004/007) to the same inventor, incorporated herein by reference. That is, the contact to substrate etch is de-coupled from the contact to gate etch. That is, as shown in FIG. 1, the contact to bit line (CB) openings 50 and the contact to substrate (CS) openings 52 will be etched simultaneously using a SAC etch. The contact to gate opening 54 will be etched later in the process. With this method, both CB and CS will be protected from misalignment between the contact holes and the gate, making the device more robust after junction and contact implantation. The dedicated gate contact etch allows this etching to be fully optimized by preventing excessive etching through the gate silicide layer and by allowing a wider contact area. The new scheme does not require new etching tools or processes, but allows independent optimization of the etch processes.

Figure 2:
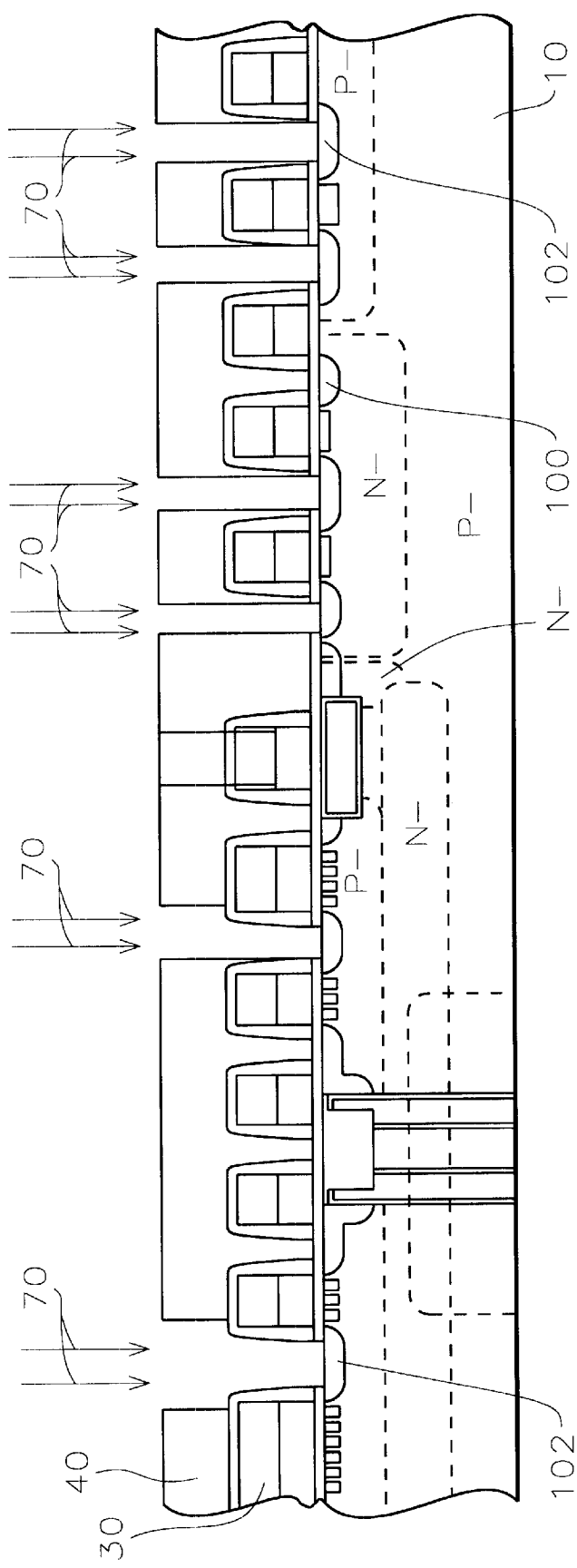

Now, referring to FIG. 2, surface amorphization is performed within the contact openings. Heavy inert ions are blanket implanted into the substrate underlying the contact openings. Ions such as Ar, Xe, Kr, or the like are implanted 70 at a dosage of between about 1E13 and 1E15 ions/cm$^2$ and energy of between about 1 and 10 KeV are implanted to form regions 102.

Alternatively, dopant ions such as In, As$_2$, Sb, BF$_2$, B$_{10}$H$_x$, and so on can be implanted through a mask, not shown, into the substrate underlying the contact openings at a dosage of between about 1E14 and 1E15 ions/cm$^2$ and energy of between about 5 and 20 KeV to form regions 102. In this alternative, surface amorphization and introduction of dopant species into the substrate is achieved concurrently.

This implantation may be by ion implantation or by plasma implantation. The result of the implantation is the amorphization of the surface of the substrate within the contact openings 50 and 52 to a depth of approximately 10 to 20 nm.

Figure 3:
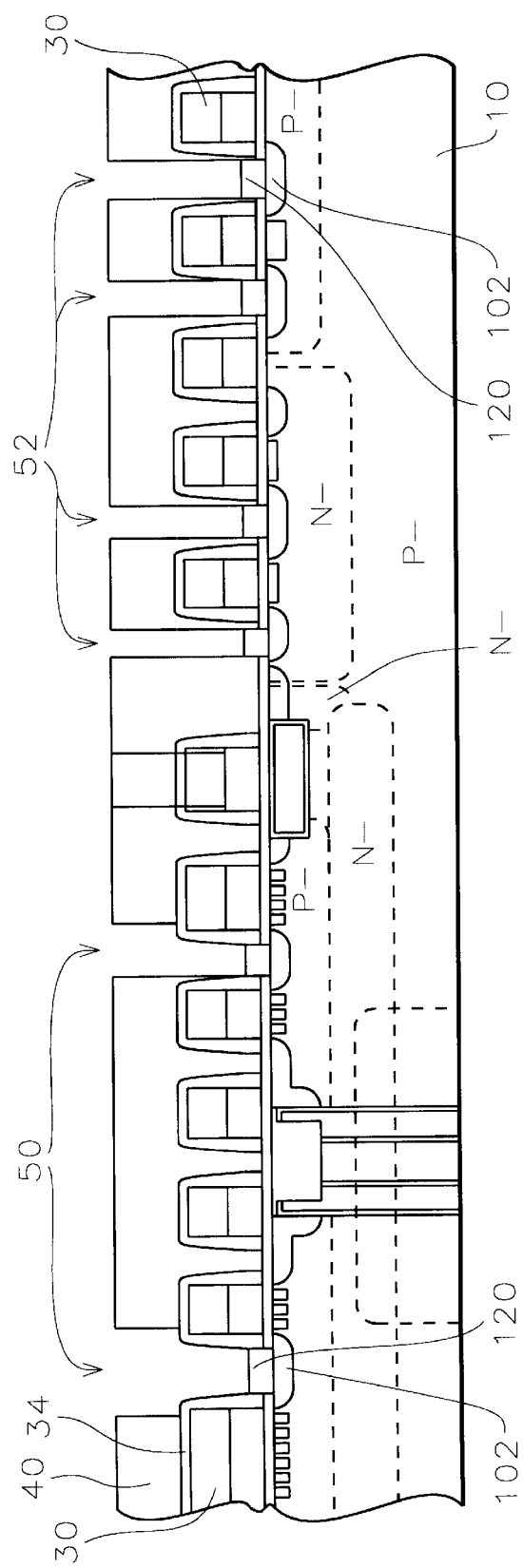

Referring now to FIG. 3, the substrate is cleaned by a conventional wet cleaning process, for example. Now, a polysilicon layer 120 is grown selectively on the amorphized substrate within the contact openings. A crystalline silicon is not necessary here within the contact openings because the polysilicon will be amorphized eventually during post annealing steps. The selective polysilicon growth can be performed by a low temperature hemispherical grain (HSG) process, for example, after surface amorphization by low energy plasma doping or ion implantation. The amorphization and HSG deposition should be optimized such that the HSG process is completed before a recrystallization takes place during the HSG process. The HSG grain size and thickness must be chosen in such a manner so that dislocation penetration into the silicon substrate is minimized. The thickness of the film 120 must be controllable for optional silicidation process integration. The thickness of the film 120 should be between about 100 and 300 Angstroms. The thickness of the film is controlled by time, temperature, and gas composition parameters.

Figure 4:
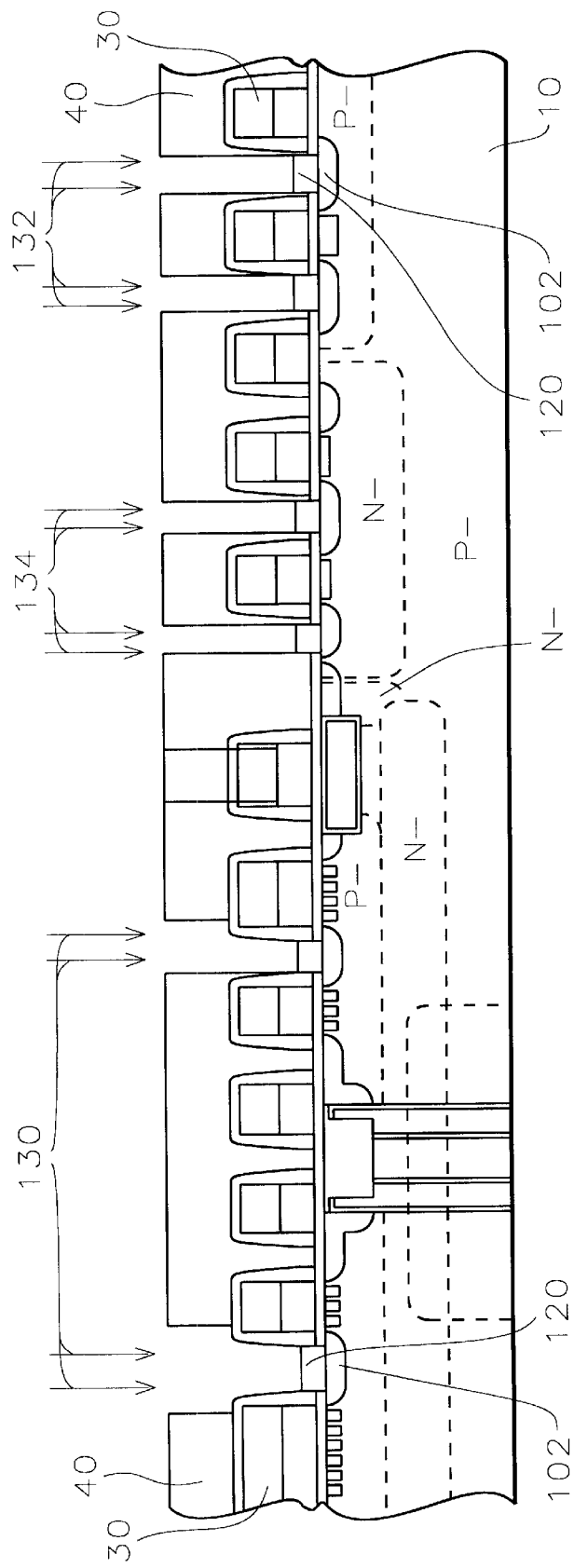

Referring now to FIG. 4, contact implantation and annealing is performed. To form a low resistance contact, the dose, implantation energy, dopant species, and anneal conditions must be optimized. Now, the polysilicon layer 120 at the bottom of the contact openings is doped. The polysilicon 120 can be doped in-situ by the dopant ions implanted into the substrate for surface amorphization or doped by plasma doping or ion implantation. The polysilicon 120 is doped to form raised contacts. The doping comprises a low energy of between about 5 and 20 KeV and less than about 30 KeV and high dosage of between about 1E14 and 1E15 ions/cm$^2$ or more than about 3E15 ions/cm$^2$.

The contact to bit line implantation 130, optional PFET implantation 134, and NFET implantation 132 are performed with appropriate blocking masks, not shown. A combination of low energy, high dose plasma doping (PLAD) and medium energy, low dose ion implantation is performed, depending on the desired process method. Now, the substrate is annealed using a rapid thermal process (RTP) or furnace annealing to drive-in the dopant to activate both the raised contacts 120 and the contact junctions 102. The annealing also recrystallizes crystal damage to the substrate.

Figure 5:
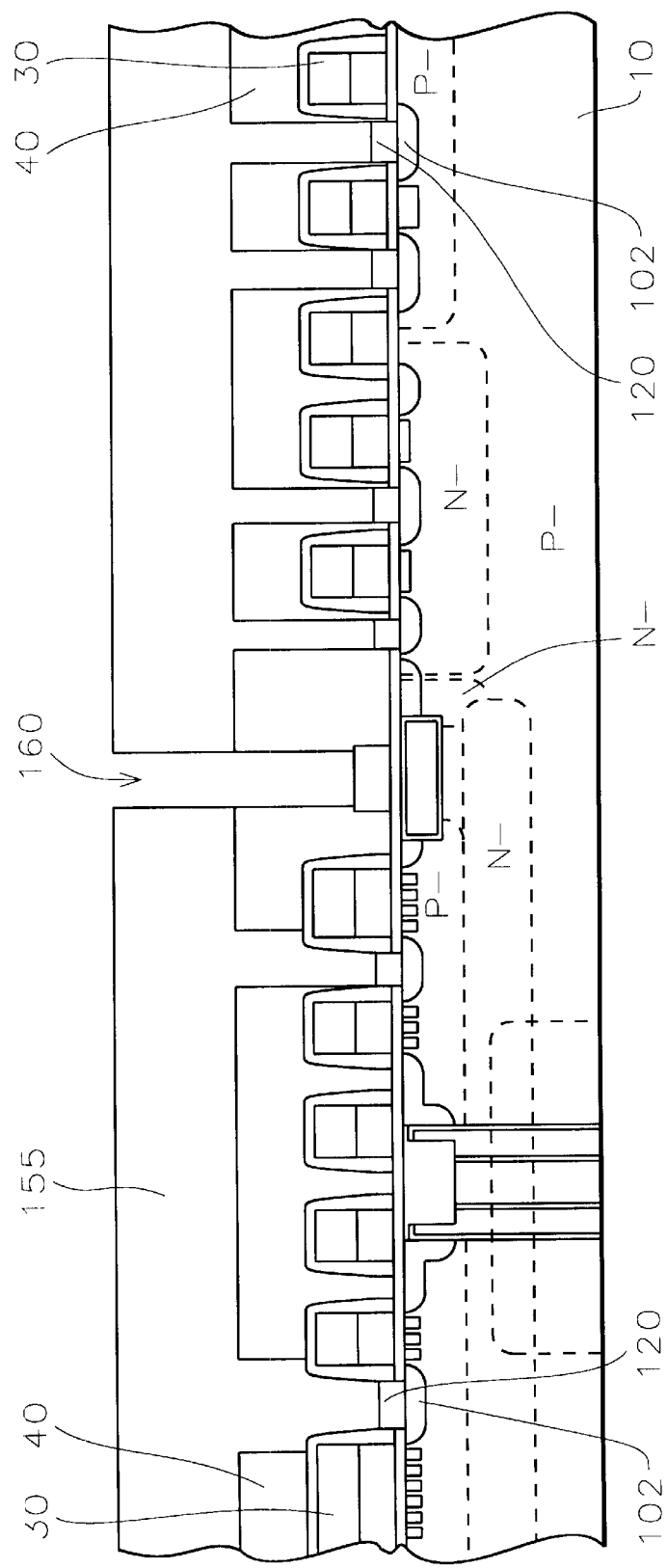

Referring now to FIG. 5, a mask 155 is formed over the wafer having openings where gate contacts are to be made. Now, the separate gate contact etch is performed. The separate gate contact etch allows independent optimization of this etch from the contact to substrate etch. This etch is a selective sequential etch for process latitude and insensitivity to process non-uniformity. This method of etching the gate contact separately is extendable to a metal gate process. Gate contact opening 160 is formed.

Figure 6:
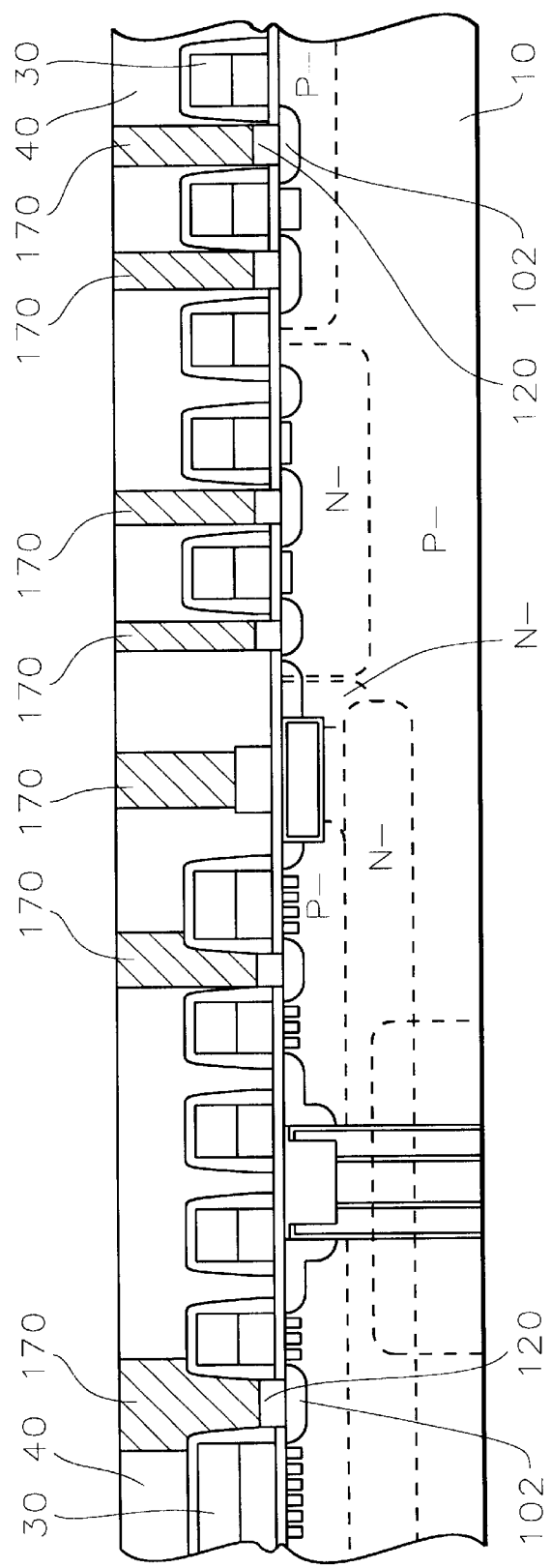

Now, the mask is removed and contacts are filled. For example, the contact openings may be filled with a metal layer 170. This metal layer may be tungsten, polysilicon, titanium nitride, or tantalum, for example, as shown in FIG. 6. Prior to this filling, silicidation may be performed within the contact openings. The raised polysilicon contacts will be mostly consumed by the silicidation process thus preserving the ultra shallow junctions underlying the polysilicon contacts.

The process of the invention provides low resistance contacts and shallow junctions having a junction depth of between about 50 and 100 nanometers.

Processing continues as is conventional in the art with higher levels of metallization, for example. The process of the present invention provides an integration method to form raised polysilicon contacts for ultra shallow junctions. The method can be applied to DRAM and non-DRAM devices.

While the invention has been particularly shown and described with reference to the preferred embodiments thereof, it will be understood by those skilled in the art that various changes in form and details may be made without departing from the spirit and scope of the invention.

What is claimed is:

1. A method of forming contacts in the fabrication of an integrated circuit device comprising:

providing semiconductor device structures in and on a substrate;

covering said semiconductor device structures with a dielectric layer;

etching through said dielectric layer to form first openings to said substrate;

amorphizing a surface of said substrate where it is exposed within said first openings;

selectively forming a polysilicon layer on said amorphized substrate surface wherein said polysilicon layer forms raised contacts;

implanting ions into said raised contacts;

thereafter etching through said dielectric layer to form second openings to gates; and filling said first and second openings with a conducting layer to complete said forming of said contacts in the fabrication of said integrated circuit device.

2. The method according to claim 1 wherein said semiconductor device structures include gate electrodes and source and drain regions.

3. The method according to claim 1 wherein said dielectric layer comprises one or more of the group containing silicon dioxide, borophosphotetraethoxysilane oxide, borophosphosilicate glass, and phosphosilicate glass.

4. The method according to claim 1 wherein said dielectric layer has a thickness of between about 6000 and 10,000 Angstroms.

5. The method according to claim 1 wherein said step of etching to form said first openings is a self-aligned contact etch.

6. The method according to claim 1 wherein said step of amorphizing said surface of said substrate comprises doping said substrate surface by a process selected from the group containing: in-situ doping, ion implantation, and plasma implantation.

7. The method according to claim 1 wherein said step of amorphizing said surface of said substrate comprises blanket implanting said substrate with ions selected from the group containing: Ar, Xe, and Kr.

8. The method according to claim 1 wherein said step of amorphizing said surface of said substrate comprises masking said substrate and implanting said substrate with ions selected from the group containing: In, $As_2$, Sb, $BF_2$, and $B_{10}H_x$.

9. The method according to claim 1 wherein said step of selectively forming a polysilicon layer on said amorphized substrate surface comprises growing a polysilicon layer using a hemispherical grain process.

10. The method according to claim 1 wherein said step of implanting ions into said polysilicon layer to form raised contacts comprises a process selected from the group containing: in-situ doping, ion implantation, and plasma implantation.

11. A method of forming contacts in the fabrication of an integrated circuit device comprising:

providing semiconductor device structures in and on a substrate;

covering said semiconductor device structures with a dielectric layer;

etching through said dielectric layer to form first openings to said substrate;

amorphizing a surface of said substrate where it is exposed within said first openings;

selectively forming a polysilicon layer on said amorphized substrate surface using a hemispherical grain process to form raised contacts;

implanting ions into said raised contacts;

thereafter etching through said dielectric layer to form second openings to gates; and filling said first and second openings with a conducting layer to complete said forming of said contacts in the fabrication of said integrated circuit device.

12. The method according to claim 11 wherein said semiconductor device structures include gate electrodes.

13. The method according to claim 11 wherein said dielectric layer comprises one or more of the group containing silicon dioxide, borophosphotetraethoxysilane oxide, borophosphosilicate glass, and phosphosilicate glass.

14. The method according to claim 13 wherein said dielectric layer has a thickness of between about 6000 and 10,000 Angstroms.

15. The method according to claim 11 wherein said step of etching to form said first openings is a self-aligned contact etch.

16. The method according to claim 11 wherein said step of amorphizing said surface of said substrate comprises doping said substrate surface by a process selected from the group containing: in-situ doping, ion implantation, and plasma implantation.

17. The method according to claim 11 wherein said step of amorphizing said surface of said substrate comprises blanket implanting said substrate with ions selected from the group containing: Ar, Xe, and Kr.

18. The method according to claim 11 wherein said step of amorphizing said surface of said substrate comprises masking said substrate and implanting said substrate with ions selected from the group containing: In, $As_2$, Sb, $BF_2$, and $B_{10}H_x$.

19. The method according to claim 11 wherein said step of implanting ions into said polysilicon layer to form raised contacts comprises a process selected from the group containing: in-situ doping, ion implantation, and plasma implantation.

20. The method according to claim 11 wherein said step of implanting ions into said polysilicon layer to form raised contacts comprises a low energy of between about 5 and 20 KeV and high dosage of between about 1E14 and 1E15 ions/$cm^2$ doping.

21. The method according to claim 11 further comprising annealing said substrate to form shallow junctions underlying said raised contacts wherein said shallow junctions have a depth of between about 50 and 100 nanometers.

22. A method of forming contacts in the fabrication of an integrated circuit device comprising:

providing semiconductor device structures in and on a substrate;

covering said semiconductor device structures with a dielectric layer;

etching through said dielectric layer to form first openings to said substrate;

amorphizing a surface of said substrate where it is exposed within said first openings;

selectively forming a polysilicon layer on said amorphized substrate surface using a hemispherical grain process to form raised contacts;

implanting ions into said raised contacts wherein said implanting comprises an energy of less than 30 KeV and a dosage of more than 3E15 ions/$cm^2$;

thereafter etching through said dielectric layer to form second openings to gates; and filling said first and second openings with a conducting layer to complete said forming of said contacts in the fabrication of said integrated circuit device.

23. The method according to claim 22 wherein said semiconductor device structures include gate electrodes.

24. The method according to claim 22 wherein said dielectric layer comprises one or more of the group containing silicon dioxide, borophosphotetraethoxysilane oxide, borophosphosilicate glass, and phosphosilicate glass.

25. The method according to claim 22 wherein said step of etching to form said first openings is a self-aligned contact etch.

26. The method according to claim 22 wherein said step of amorphizing said surface of said substrate comprises doping said substrate surface by a process selected from the group containing: in-situ doping, ion implantation, and plasma implantation.

27. The method according to claim 22 wherein said step of amorphizing said surface of said substrate comprises blanket implanting said substrate with ions selected from the group containing: Ar, Xe, and Kr.

28. The method according to claim 22 wherein said step of amorphizing said surface of said substrate comprises masking said substrate and implanting said substrate with ions selected from the group containing: In, $As_2$, Sb, $BF_2$, and $B_{10}H_x$.

29. The method according to claim 22 wherein said step of implanting ions into said polysilicon layer to form raised contacts comprises a process selected from the group containing: in-situ doping, ion implantation, and plasma implantation.

30. The method according to claim 22 further comprising annealing said substrate to form shallow junctions underlying said raised contacts wherein said shallow junctions have a depth of between about 50 and 100 nanometers.

* * * * *